United States Patent
Liao et al.

(10) Patent No.: US 9,431,604 B2
(45) Date of Patent: Aug. 30, 2016

(54) RESISTIVE RANDOM ACCESS MEMORY (RRAM) AND METHOD OF MAKING

(71) Applicant: TAIWAN SEMICONDUCTOR MANUFACTURING COMPANY, LTD., Hsinchu (TW)

(72) Inventors: Yu-Wen Liao, New Taipei (TW); Wen-Ting Chu, Kaohsiung (TW); Kuo-Chi Tu, Hsinchu (TW); Chin-Chieh Yang, New Taipei (TW); Chih-Yang Chang, Yuanlin Township (TW); Hsia-Wei Chen, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 295 days.

(21) Appl. No.: 13/714,719

(22) Filed: Dec. 14, 2012

(65) Prior Publication Data
US 2014/0166961 A1 Jun. 19, 2014

(51) Int. Cl.
*H01L 45/00* (2006.01)

(52) U.S. Cl.
CPC ............ *H01L 45/1253* (2013.01); *H01L 45/04* (2013.01); *H01L 45/1233* (2013.01); *H01L 45/146* (2013.01); *H01L 45/1675* (2013.01)

(58) Field of Classification Search
CPC .................. H01L 45/1233; H01L 45/1253
See application file for complete search history.

(56) References Cited

U.S. PATENT DOCUMENTS

| | | | |
|---|---|---|---|
| 3,271,591 A | 9/1966 | Ovshinksy | |
| 6,677,637 B2 | 1/2004 | Bernstein et al. | |
| 6,737,728 B1 | 5/2004 | Block et al. | |
| 6,781,185 B2 | 8/2004 | Chen et al. | |
| 6,803,641 B2 * | 10/2004 | Papa Rao | H01L 27/0805 257/306 |
| 6,849,891 B1 | 2/2005 | Hsu et al. | |
| 6,936,881 B2 | 8/2005 | Yeo et al. | |
| 6,937,457 B2 | 8/2005 | Shih et al. | |
| 6,940,705 B2 | 9/2005 | Yeo et al. | |
| 7,195,970 B2 | 3/2007 | Tu et al. | |
| 7,407,858 B2 | 8/2008 | Li et al. | |
| 7,557,399 B2 | 7/2009 | Tu et al. | |

(Continued)

FOREIGN PATENT DOCUMENTS

JP 11297942 10/1999
JP 2001036026 2/2001

OTHER PUBLICATIONS

Office Action dated Apr. 9, 2014 from corresponding application No. DE 10 2013 103 503.5.

*Primary Examiner* — Raj R Gupta
(74) *Attorney, Agent, or Firm* — Hauptman Ham, LLP

(57) ABSTRACT

The present disclosure provides a resistive random access memory (RRAM) cells and methods of making the same. The RRAM cell includes a transistor and an RRAM structure electrically connected to the transistor. The RRAM structure includes a bottom electrode having a via portion and a top portion, a resistive material layer over the bottom electrode and having a same width as the top portion of the bottom electrode, and a top electrode over the resistive material layer and having a smaller width than the resistive material layer.

20 Claims, 8 Drawing Sheets

(56) References Cited

U.S. PATENT DOCUMENTS

| | | | |
|---|---|---|---|
| 7,772,581 B2* | 8/2010 | Lung | G11C 11/5678 257/3 |
| 8,000,128 B2 | 8/2011 | Li et al. | |
| 8,009,454 B2 | 8/2011 | Lee et al. | |
| 2005/0001284 A1 | 1/2005 | Pellizzer | |
| 2007/0045605 A1 | 3/2007 | Hsueh | |
| 2008/0061341 A1 | 3/2008 | Lung | |
| 2010/0027316 A1* | 2/2010 | Yoon | G11C 5/02 365/148 |
| 2011/0001108 A1* | 1/2011 | Greene | H01L 27/2436 257/2 |
| 2012/0061732 A1* | 3/2012 | Hirai | G11C 13/0007 257/211 |
| 2012/0286231 A1 | 11/2012 | Saito et al. | |

\* cited by examiner

RESISTIVE RANDOM ACCESS MEMORY (RRAM) AND METHOD OF MAKING

FIELD

The disclosure relates to semiconductor devices and, more particularly, to resistive random-access memory (RRAM) device structures and methods of making RRAM devices.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance, rather than electronic charge. Particularly, each RRAM cell includes a resistive material layer, the resistance of which can be adjusted to represent logic "0" or logic "1." RRAM devices operate under the principle that a dielectric, which is normally insulating, can be made conductive through a filament or conduction path formed after the application of a sufficiently high voltage. The forming of a filament or conduction path is the forming operation or forming process of the RRAM. The sufficiently high voltage is the 'form' voltage. The conduction path formation can arise from different mechanisms, including defect, metal migration, and/or other mechanisms. Various different dielectric materials may be used in RRAM devices. Once the filament or conduction path is formed, it may be reset, i.e., broken, resulting in high resistance or set, i.e., re-formed, resulting in lower resistance, by an appropriately applied voltage. There are various architectures to configure an array of RRAM cells. For example, a cross-point architecture include a RRAM in each cell configured at the crossing of a word line and a bit line. Recently, a transistor type architecture pairs a RRAM with a transistor (1T1R) in each cell is proposed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
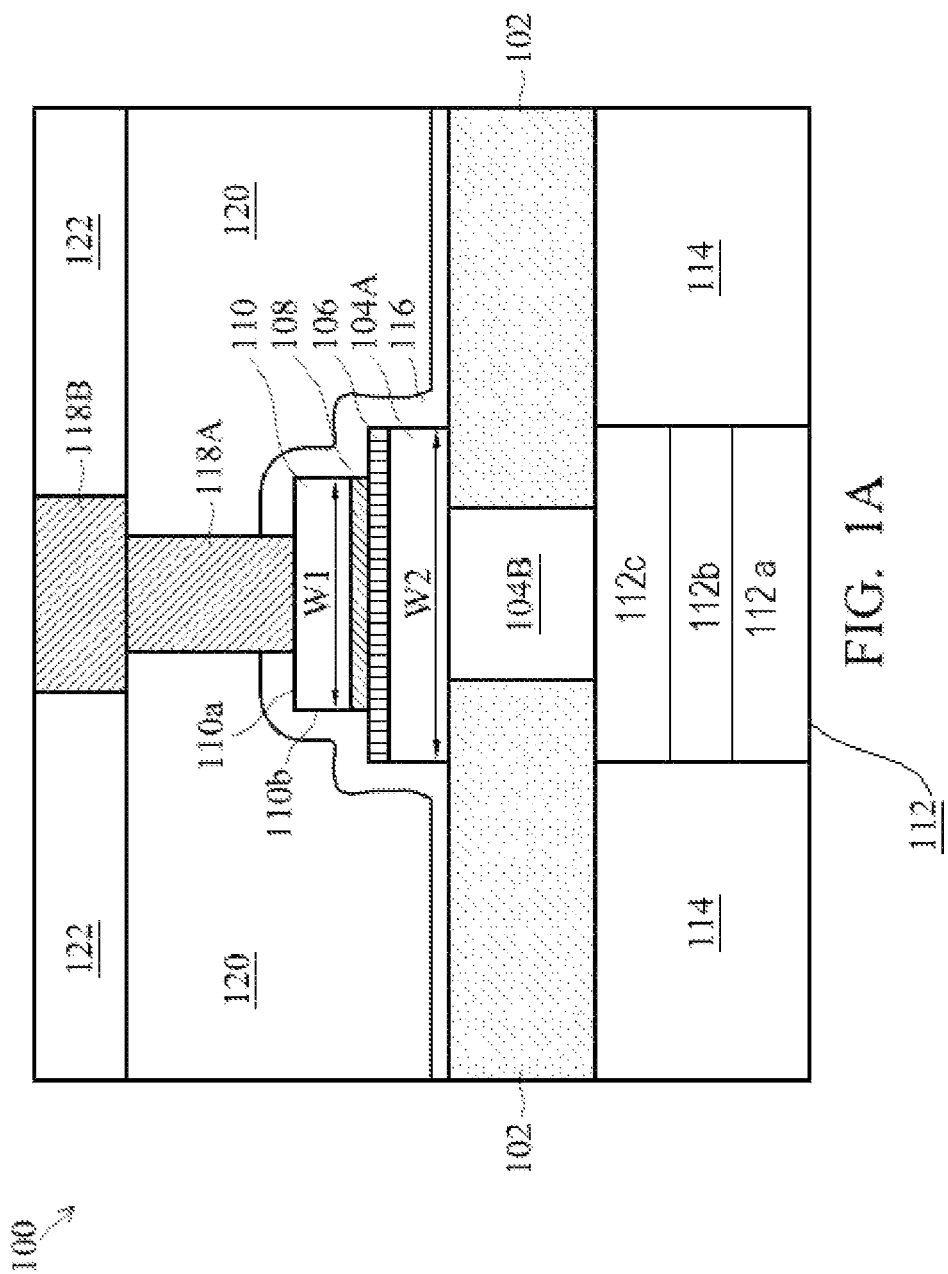
FIG. 1A is a cross sectional view of a resistive random access memory (RRAM) structure in accordance with various embodiments of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below.

FIG. 1A is a cross sectional view of a resistive random access memory (RRAM) structure embedded in a multilevel interconnect (MLI) structure over a transistor in accordance with various embodiments of the present disclosure. The RRAM structure 100 includes a bottom electrode 104A/B in and over a RRAM stop layer 102, a resistive material layer 106, and a top electrode 110. The bottom electrode comprises two portions, a via portion 104B embedded in the RRAM stop layer 102 and a top portion 104A over the via portion 104B and the RRAM stop layer 102. The top portion 104A is referred to in the following description as "bottom electrode 104A." A metal/dielectric layer is disposed below the RRAM stop layer 102 and includes one or more metal features 112 embedded in dielectric layer 114. In some embodiments, metal features 112 includes a first metal layer 112a embedded in dielectric layer 114. In some embodiments, a second metal layer 112b is over the first metal layer 112. In some embodiments, a third metal layer 112c is over the second metal layer 112b. An optional capping layer 108 may be disposed between the top electrode 110 and the resistive material layer 106. A second RRAM stop layer 116 covers the top electrode 110, capping layer 108, resistive material layer 106, and top portion 104A of the bottom electrode. A contact material having two portions: a via contact 118 A and a metal feature 118B electrically connects to the top electrode 110 through the second RRAM stop layer 116. A dielectric material 120 fills the regions between adjacent RRAM structures 100 over the second RRAM stop layer 116. Another dielectric material 122 is disposed over the dielectric material 120 and the metal feature 118B is embedded therein. The dielectric material 120 may be formed of the same material as the dielectric material 122 and also dielectric layer 114.

As shown in FIG. 1A, the widths of various features of the RRAM structures are different. The top electrode 110 has a width W1 that is smaller than the width W2 of the bottom electrode 104A. According to some embodiments, when used, the capping layer 108 has the same width as the top electrode 110. The resistive material layer 106 may have the same width as the bottom electrode 104A. In some cases, the resistive material layer 106 may have the same width as the top electrode 110. The ratio of W1 to W2 may be about or less than 0.75. It is believed that a greater ratio would result in sidewall damage, causing a defect that can lead to higher initial cell leakage. However, a small ratio would reduce the effective RRAM size. If the ratio of W1 to W2 is about or less than 0.55, then the overall RRAM size would be much larger than an effective RRAM size and the number of cells per area would be lower than if the ratio is higher. According to various embodiments, the ratio of the top electrode width W1 over the bottom electrode W2 width is about or greater than 0.55 and about or less than 0.75.

The RRAM structure 100 has two or more states with different electric resistance values that correspond to a different digital value. The RRAM structure 100 switches from one state to another by applying a predetermined voltage or current to the RRAM structure 100. For example, the RRAM structure 100 has a state of relatively high resistance, referred to as "a high resistance state", and a state of relatively low resistance, referred to as "a low resistance state". The RRAM structure 100 may be switched from the high resistance state to the low resistance state, or from the low resistance state to high resistance state by applying a predetermined voltage or current to the electrodes.

In a memory bit cell having one transistor and one RRAM (1T1R) the bottom electrode 104A/B is electrically connected to a drain electrode of a transistor through the MLI. In some embodiments, the RRAM structure is placed between the fourth metal layer (M4) and the fifth metal layer (M5). In other embodiments, the RRAM structure is placed between other metal layers. In still other embodiments, the RRAM structure includes several layers placed between several corresponding pairs of metal layers. Such a RRAM structure may be made when the footprint of the RRAM is larger than that of the corresponding transistor so that it is difficult to ensure a one transistor one RRAM match in one layer of RRAM.

The bottom electrode 104 may be made of gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the bottom electrode 104 may be between a range about 100-500 nm. In some embodiments, the bottom electrode includes a via portion and a top portion. The via portion may include one or more layers and may be a conductive barrier material to a metal feature below. The top portion may also include one or more layers. In one embodiment, the bottom electrode includes a tantalum nitride layer and a titanium nitride layer.

A resistive material layer 106 is formed on the bottom electrode 104 and directly contacts to the bottom electrode 104. The thickness of the resistive material layer 106 may be between a range about 20-100 nm. The resistive material layer may include one or more oxide of W, Ta, Ti, Ni, Co, Hf, Ru, Zr, Zn, Fe, Sn, Al, Cu, Ag, Mo, Cr. In some cases, silicon may be included to form a composite material. In some embodiments, hafnium oxide and/or zirconium oxide is used.

A top electrode 110 is formed over the resistive material layer 106. The top electrode 110 may be formed from materials such as gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the top electrode 110 may be between a range about 100-500 nm.

Figure 1B:
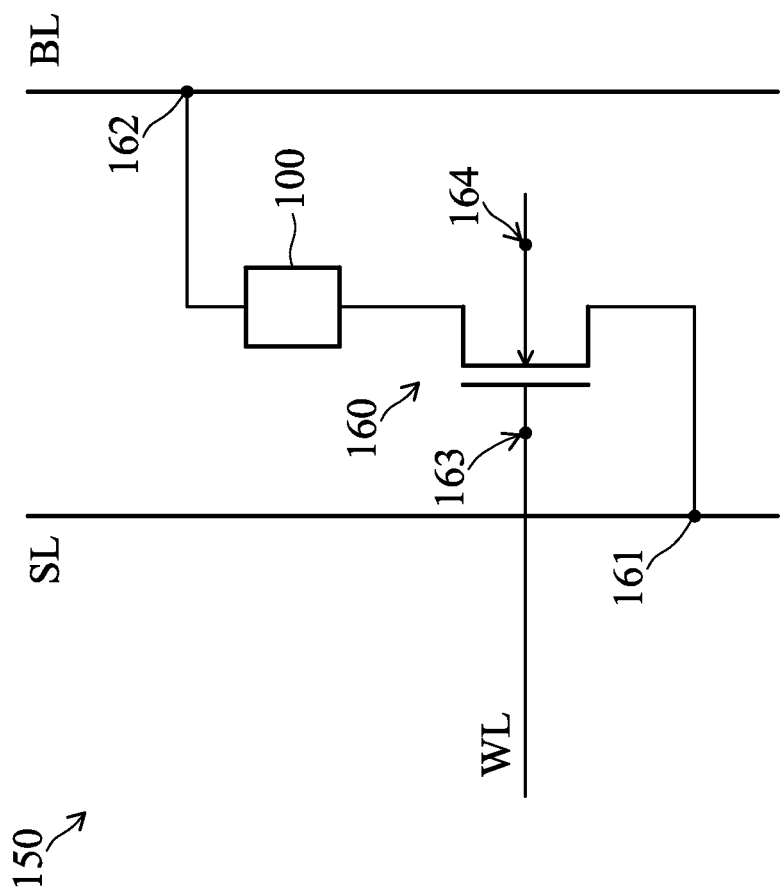
FIG. 1B is an electrical diagram of a RRAM cell in accordance with various embodiments of the present disclosure.

FIG. 1B is an electrical diagram of a RRAM cell 150 in accordance with various embodiments of the present disclosure. The RRAM cell 150 includes a transistor 160 and the RRAM structure 100 described with respect to FIG. 1A. The RRAM structure 100 and the transistor 160 are formed on a semiconductor substrate. The RRAM structure 100 is electrically connected to the transistor 160. For example, one of the electrodes 104A/110 of the RRAM structure 100 is electrically connected to one of the source/drain regions of the transistor 160. The other of the source/drain regions of the transistor 160 is electrically connected to a source line SL via a source line contact 161. The other of the electrodes 104A/110 of the RRAM structure 100 is electrically connected to a bit line BL via a bit line contact 162. The gate of the transistor 160 is electrically connected to a world line WL via a gate contact 163. The RRAM cell 150 in accordance with some embodiments is an 1T1R memory cell that is controlled through at least four electrical connections to read, write, and form the memory cell. Specifically, the gate contact 163 to the gate of the transistor 160 controls a gate voltage that allows a channel region of the transistor 160 to conduct. A body contact 164 may be used to connect to the semiconductor substrate and provide a ground for or to bias the transistor 160. The source line contact 161 and the bit line contact 162 are connected to the RRAM structure 100 directly or via the transistor 150.

The operation of the RRAM cell 150 in accordance with some embodiments will be now described with reference to both FIGS. 1A and 1B. During memory cell 'form' operation, a specified voltage is conducted across the RRAM structure 100 between the bottom electrode 104A/B and the top electrode 110. The voltage is provided through the transistor 160 from the bit line contact 162 across to the source line contact 161. The 'form' voltage is usually a different voltage from the voltage used to read and write the memory cell and is usually at a higher absolute value or has a different polarity. In one example, the voltage difference may be 3 volts or greater, or about 5 volts. During the 'form' operation, a bias may be provided via the body contact 164. In some embodiments, the 'form' voltage is provided directly through the MLI while bypassing the transistor associated with the memory cell.

After the 'form' operation, one or more filament conductors are disposed across the resistive material layer 106. The resistance across the resistive material layer 106 is at a low value and a high current may be passed when the transistor is selected. During the write operation, the one or more filament conductors are broken by passing a voltage different from the 'form' voltage. In some embodiments, the 'write' voltage may have a different polarity than the 'form' voltage. In one example, the voltage difference is about 1 volt. After the one or more filament conductors are broken, the resistance across the resistive material layer 106 is at a high value and a low current or no current may be passed when the transistor is selected. A subsequent write operation applies yet a different voltage that is less than the 'form' voltage to reconnect the broken filament conductors. By breaking or reconnecting the filament conductors, a high or low resistance is stored in the memory cell that does not change when the power is removed. Either the high resistance or the low resistance may be read as a "0" or "1", respectively. During a read operation, a 'read' voltage is applied across the RRAM structure 100. In some examples, the 'read' voltage is between about 0.3 volts to about 0.5 volts. The 'read' voltage is much smaller than the 'write' voltage to avoid inadvertent writing of the memory cell to a different value.

A memory cell, such as the RRAM cell 150, is usually connected to an array of memory cells either embedded in a logic device or as a stand-alone memory device. Memory cell arrays are organized into bit lines and word lines. For example, as illustrated in FIG. 1B, the bit line contact 162 is connected to the bit line BL of the memory cell array and the gate contact 163 is connected to the word line WL of the memory cell array.

Figure 2:
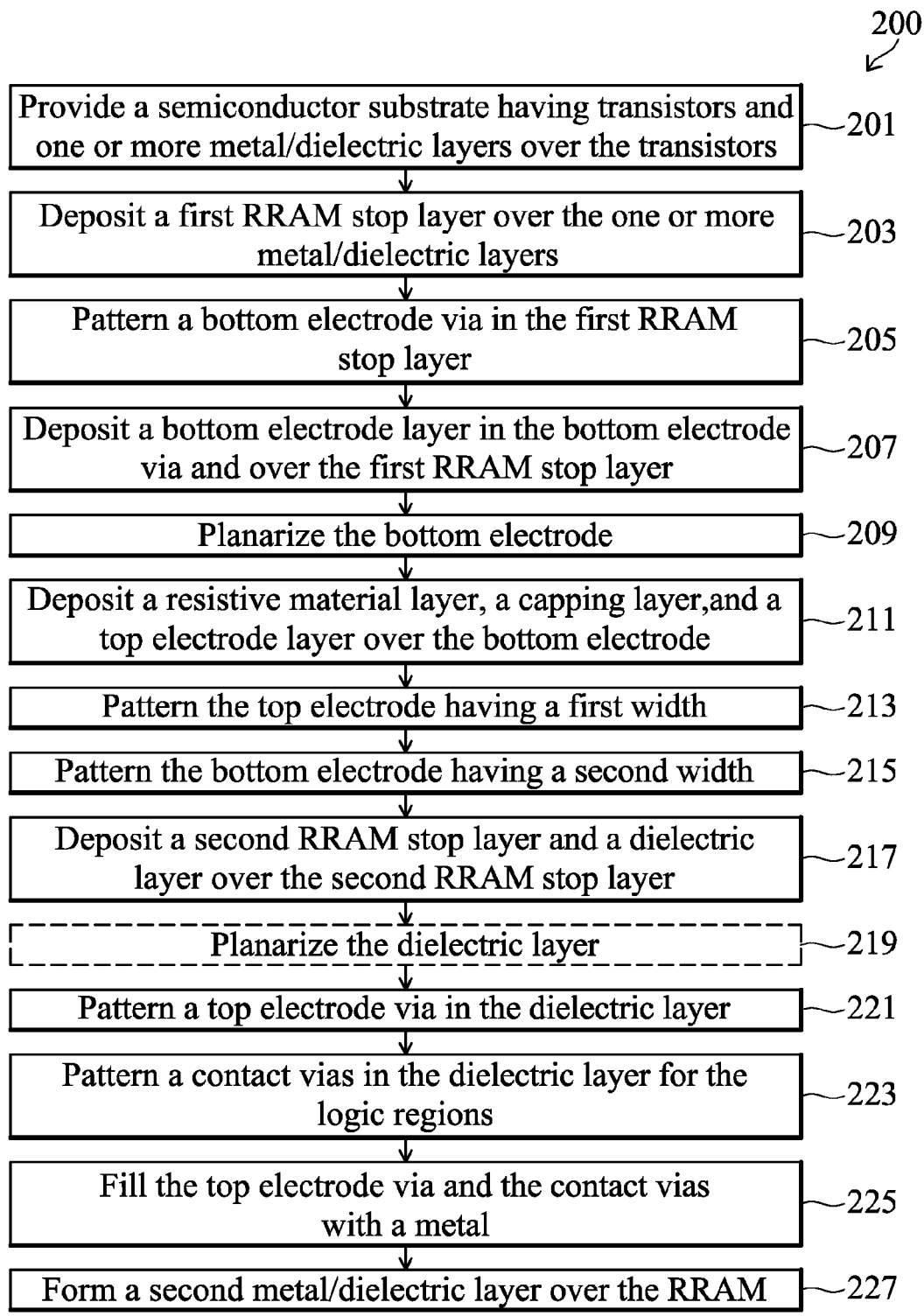
FIG. 2 is a flowchart of a method of making a RRAM cell according to aspects of the present disclosure in various embodiments.

FIG. 2 is a flowchart of a method 200 of making a memory device according to aspects of the present disclosure in various embodiments. Various operations of the method 200 are discussed in association with the cross-section diagrams in FIGS. 3-11. In operation 201 of method 200, a semiconductor substrate having transistors and one or more metal/dielectric layers over the transistors is provided. The semiconductor substrate may be a silicon substrate. Alternatively, the substrate may comprise another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. In the present disclosure, a wafer is a workpiece that includes a semiconductor substrate and various features formed in and over and attached to the semiconductor substrate. The wafer may be in various stages of fabrication and is processed using the CMOS process. The transistors are formed by known transistor fabrication processes and may be a planar transistor, such as polysilicon gate transistors or high-k metal gate transistors, or a multi-gate transistor, such as fin field effect transistors. After the transistors are formed, one or more metal/dielectric layers of a multi-level interconnect (MLI) is formed over the transistors. According to some embodiments, four metal/dielectric layers are formed over the transistors.

In operation 203, a first RRAM stop layer is deposited over the one or more metal/dielectric layers. The first RRAM stop layer may be silicon carbide, silicon oxynitride, silicon nitride, carbon doped silicon nitride or carbon doped silicon oxide. The first RRAM stop layer is selected to have a different etch selectivity than the bottom electrode material. The first RRAM stop layer is deposited over a planarized metal/dielectric layer using a chemical vapor deposition (CVD) process such as plasma enhanced (PE) CVD, high-density plasma (HDP) CVD, inductively-coupled-plasma (ICP) CVD, or thermal CVD.

Figure 3:
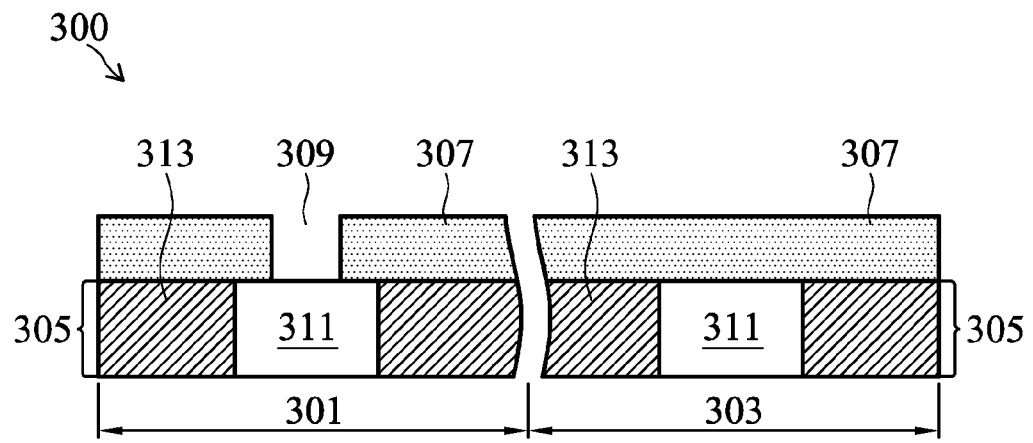
FIGS. 3-11 are cross sectional diagrams of a partially fabricated RRAM structure in various stages of fabrication in accordance with various embodiments of the present disclosure.

In operation 205, a bottom electrode via is patterned in the first RRAM stop layer. The bottom electrode via is formed by first depositing a photoresist over the first RRAM stop layer, exposing a portion of the photoresist to a radiation, developing the photoresist, and etching the bottom electrode via in the first RRAM stop layer using the photoresist as an etch mask. FIG. 3 is a cross section diagram of portions of a wafer after operation 205. The wafer 300 includes a RRAM portion 301 and a logic device portion 303. Various operations of method 200 is performed in the RRAM portion 301 and conventional MLI formation is performed in the logic device portion 303. The transistor and metal/dielectric layers below the RRAM level are not shown. The cross section of FIG. 3 includes a metal/dielectric layer 305 including both metal feature 311 and dielectric material 313. A first RRAM stop layer 307 is deposited over the metal/dielectric layer 305 for both the RRAM portion 301 and the logic device portion 303. A bottom electrode via 309 is formed in the first RRAM stop layer 307 over the metal feature 311 in the RRAM portion 301.

Figure 4:
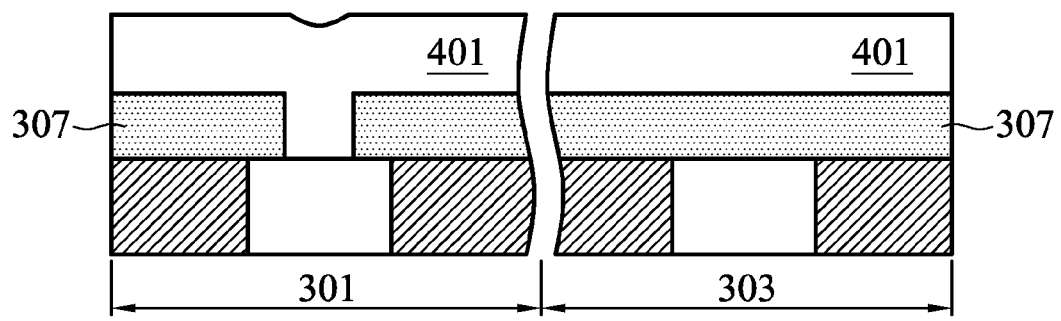

Referring back to FIG. 2, in operation 207, a bottom electrode layer is deposited in the bottom electrode via and over the first RRAM stop layer. The bottom electrode layer may be tantalum nitride, titanium nitride, tungsten, or copper deposited using a physical vapor deposition (PVD) process or a plating process. In some cases, a liner or a barrier layer may be deposited first, followed by a deposition of the bulk material using one of the known deposition methods. Because the bottom electrode layer deposition fills the bottom electrode via and covers the first RRAM stop layer, the portion of the bottom electrode layer over the bottom electrode via may have different thickness above the bottom electrode via as compared to the bottom electrode layer not over the bottom electrode via. FIG. 4 is a cross section diagram of portions of a wafer after operation 207 including a bottom electrode layer 401 over the first RRAM stop layer. As shown in FIG. 4, a top surface of the bottom electrode layer 401 may be uneven over the bottom electrode via.

Figure 5:
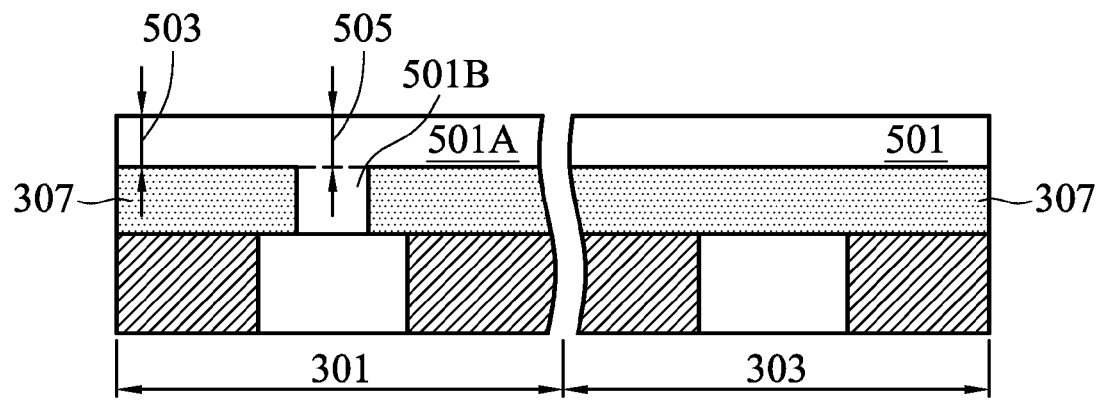

Referring back to FIG. 2, in operation 209, the bottom electrode is planarized. The planarization is performed with a chemical mechanical polishing (CMP) process. The planarization is tuned to minimize thickness variations of the top portion of the bottom electrode. Referring to FIG. 5, the bottom electrode layer 501 includes a top portion 501A and via portion 501B. Dimension 503 is the thickness of the top portion 501A of the bottom electrode over the first RRAM stop layer 307 and dimension 505 is the thickness of the top portion 501A of the bottom electrode over the via portion 501B of the bottom electrode. The ratio of dimension 505 over dimension 503 is about 0.95 or greater, up to about 1. Because of the dishing when the bottom electrode is deposited, dimension 505 is very unlikely to become greater than dimension 503 after a planarization process. The high uniformity of the top portion 501A of the bottom electrode provides a uniform electric field during operation and increases the accuracy of the memory cell.

Referring back to FIG. 2, in operation 211, a resistive material layer, a capping layer, and a top electrode layer is deposited sequentially over the bottom electrode. The resistive material layer of the RRAM is a metal oxide, which may be hafnium oxide, zirconium oxide, aluminum oxide, nickel oxide, tantalum oxide, titanium oxide, and other known oxides used as a resistive material layer. The metal oxide may have a non-stoichiometric oxygen to metal ratio. Depending on the method of deposition, the oxygen to metal ratio and other process conditions may be tuned to achieve specific resistive material layer properties. For example, a set of conditions may yield a low 'forming' voltage and another set of conditions may yield a low 'read' voltage. The metal oxide may be deposited. In some embodiments, the metal oxide is a transition metal oxide. In other embodiments, the resistive material layer is a metal oxynitride.

The resistive material layer may be formed by a suitable technique, such as atomic layer deposition (ALD) with a precursor containing a metal and oxygen. Other chemical vapor deposition (CVD) techniques may be used. In another example, the resistive material layer may be formed by a physical vapor deposition (PVD), such as a sputtering process with a metallic target and with a gas supply of oxygen and optionally nitrogen to the PVD chamber. In yet another example, the resistive material layer may be formed an electron-beam deposition process. The resistive material layer may have a thickness ranging between about 20 angstroms and about 100 angstroms, or between about 40 angstroms and about 100 angstroms. Thicker resistive material layers result in higher forming voltage. However, a thin resistive material layer may be susceptible to current leakage if over etched and is more sensitivity to surface and thickness non-uniformity.

The capping layer of the RRAM over the resistive material layer is a metal. In various embodiments, the capping layer includes, for example, titanium, hafnium, platinum, and/or tantalum. The capping layer may be deposited using a PVD process, a CVD, for example, an ALD process. The capping layer may have a thickness ranging between about 20 angstroms and about 100 angstroms, or between about 40 angstroms and about 80 angstroms.

The top electrode may be metal, metal-nitride, doped polysilicon or other suitable conductive material. For example, the top electrode may be tantalum nitride, titanium nitride, or platinum. The top electrode may be formed by PVD, CVD including ALD, or other suitable technique and has a thickness ranging between about 100 angstrom and about 500 angstroms. Alternatively, the top electrode includes other suitable conductive material to electrically connect the device to other portion of an interconnect structure for electrical routing.

Figure 6:
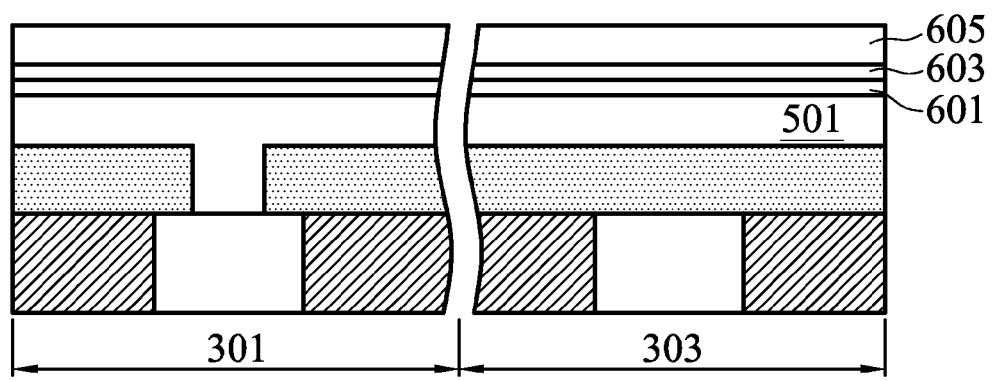

In some embodiments, the layers are deposited in one system without breaking vacuum. Specifically, one or more of the layers may be deposited in the same chamber or each one in a different chamber on the same vacuum system. In other embodiments, more than one semiconductor processing system is used. FIG. 6 is the cross section diagram showing top electrode 605 over capping layer 603 over resistive material layer 601 over the bottom electrode 501.

Figure 7:
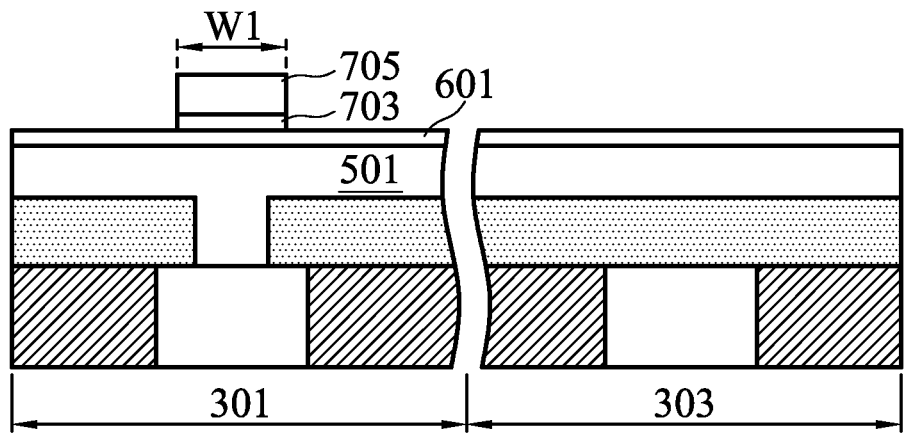

Referring back to FIG. 2, in operation 213, the top electrode having a first width is patterned. The patterning includes a photolithography operation where a photoresist is deposited, a pattern is defined by exposing photoresist to a radiation, and developing the photoresist to create a photoresist pattern. The photoresist pattern is then used as an etch mask to protect desired portions of the RRAM structure. As shown in FIG. 7, a portion of the top electrode layer and a portion of the capping layer are removed from the RRAM portion 301 of the wafer. All of the top electrode layer and capping layer are removed from the logic device portion 303 of the wafer. As shown in FIG. 7, a top electrode 705 having a width W1 and a capping layer 703, if used, having the width W1 remain over the resistive material layer 601. In some embodiments, the capping layer and the top electrode may be formed of the same material, but using different processes so as to vary a specific material property. The etch process stops when the resistive material layer 601 is reached. Techniques are available to detect the end of etching when a new material layer is reached so as to limit the amount of over etching.

Figure 8:
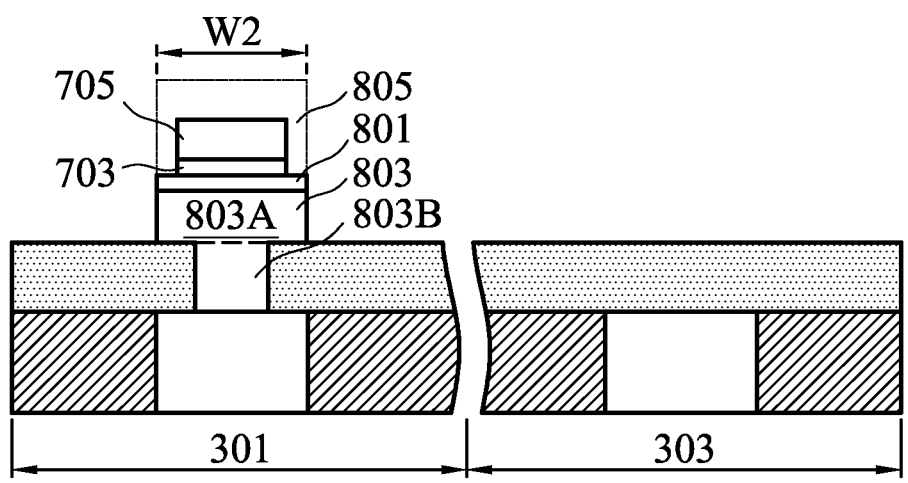

Referring back to FIG. 2, in operation 215, the bottom electrode is patterned having a second width. Just as the patterning of the top electrode, the patterning includes depositing, exposing, and developing the photoresist according to a photomask different form the one used in operation 213. In many embodiments, a hardmask material is deposited first over the top electrode and the capping layer, and the photoresist is used as an etch mask to define the hardmask first. As shown in FIG. 8, the photoresist/hardmask 805 covers the top electrode 705 and the capping layer 703 and has a width W2. The photoresist/hardmask 805 is used as an etchmask to remove a portion of the resistive material layer 601 and bottom electrode layer 501 of FIG. 7 to form the resistive material layer 801 and the bottom electrode 803. During the etching, the etchant also attacks the photoresist/hardmask 805 material such that by the time the unwanted portions of the bottom electrode are removed, the photoresist/hardmask 805 may be consumed as well.

According to various embodiments of the present disclosure, a ratio of the widths W1 to W2 is less than about 0.75.

When the ratio is greater than about 0.75, the likelihood of a sidewall defect that can cause initial cell leakage is higher. Particularly, when the ratio is about one, only one etch mask is used to reach the bottom electrode, as in an existing proposal for making 1T1R memory cells. During the bottom electrode etching, redeposit of bottom electrode material and damage to the sidewall of the capping layer and the resistive material layer can cause a conductive path to form. According to the present disclosure, a photoresist/hardmask 805 protects the more vulnerable sidewalls during the bottom electrode etching. When the photoresist/hardmask 805 is sufficiently thick to withstand high energy etching used to remove unwanted portions of the bottom electrode, then sidewall defects of the capping layer is minimized. However, when the ratio of W1 to W2 is between 0.75 and about 1, the photoresist/hardmask 805 may be consumed before all of the unwanted portions of the bottom electrode are removed. Thus, when the ratio of W1 to W2 is between 0.75 and 1, mask materials with very good etch selectivity against the bottom electrode material are used.

A portion of the resistive material layer 801 may also be damaged by the redeposit of bottom electrode material and sidewall defects from etching. However, when the ratio is about or below 0.75, any damaged portion (i.e., a corner of resistive material layer 801 not covered by the overlying capping layer) is not a part of the electrical pathway during operation and does not affect the memory cell operation.

While at least one benefit to the memory cell leakage is found for W1/W2 ratios of about or less than 0.75, much smaller W1/W2 ratios do not continue to improve memory cell performance. While a small W1/W2 ratio, for example, less than about 0.55 can produce a device with little or no leakage, a greater silicon real estate is used to produce little or no improvement. Thus according to various embodiments of the present disclosure, an optimal ratio of W1 to W2 is about 0.55 to about 0.75 although other W1/W2 ratios are not excluded.

The bottom electrode 803 includes two portions, a top portion 803A and a via portion 803B. The via portion 803B of the bottom electrode 803 is unchanged from the via portion of 501B of the bottom electrode layer 501; however, the top portion 803A of the bottom electrode 803 is smaller than the top portion 501A of the bottom electrode layer 501.

Referring back to FIG. 2, in operation 217, a second RRAM stop layer and a dielectric layer over the second RRAM stop layer is deposited. The second RRAM stop layer may be the same material as the first RRAM stop layer. The second RRAM stop layer may be silicon carbide, silicon oxynitride, silicon nitride, carbon doped silicon nitride or carbon doped silicon oxide. The second RRAM stop layer is selected to have a different etch selectivity than the overlying dielectric layer material. The second RRAM stop layer is deposited conformally over the RRAM structure using a chemical vapor deposition (CVD) process such as plasma enhanced (PE) CVD, high-density plasma (HDP) CVD, inductively-coupled-plasma (ICP) CVD, or thermal CVD. The conformity process window depends partially on the aspect ratio of the RRAM structure, which depends on the top electrode thickness. Thus in various embodiments, the top electrode thickness is not more than 500 angstroms.

The dielectric layer is deposited over the second RRAM stop layer. The dielectric layer may be the same material as the dielectric material 313 in the metal/dielectric layer 305 of FIG. 3. The dielectric layer may be silicon oxide, low-k silicon oxide such as a porous silicon oxide layer, or other commonly used interlayer dielectric (ILD) material. The dielectric layer completely fills the area between adjacent RRAM structures and covers the RRAM structures.

Referring back to FIG. 2, in optional operation 219, the dielectric layer is planarized. Depending on the method of deposition, the dielectric layer may have an uneven top surface. During subsequent contact etch, an uneven top surface may cause unwanted overetching and some portion and underetching in other portions. A CMP process is usually used to planarize the dielectric layer.

A top electrode via is patterned in operation 221. The top electrode via extends from the top of the dielectric layer to the top electrode. Operation 221 may be performed in two steps: in a first step, a first pattern and etch stops on top of the second RRAM stop layer and in a second step, the second RRAM stop layer is etched through to the top electrode. The first step of pattern and etch is performed using known processes. The second step of etching through the second RRAM stop layer may be performed together with contact etching in the logic device as a part of operation 223.

Figure 9:
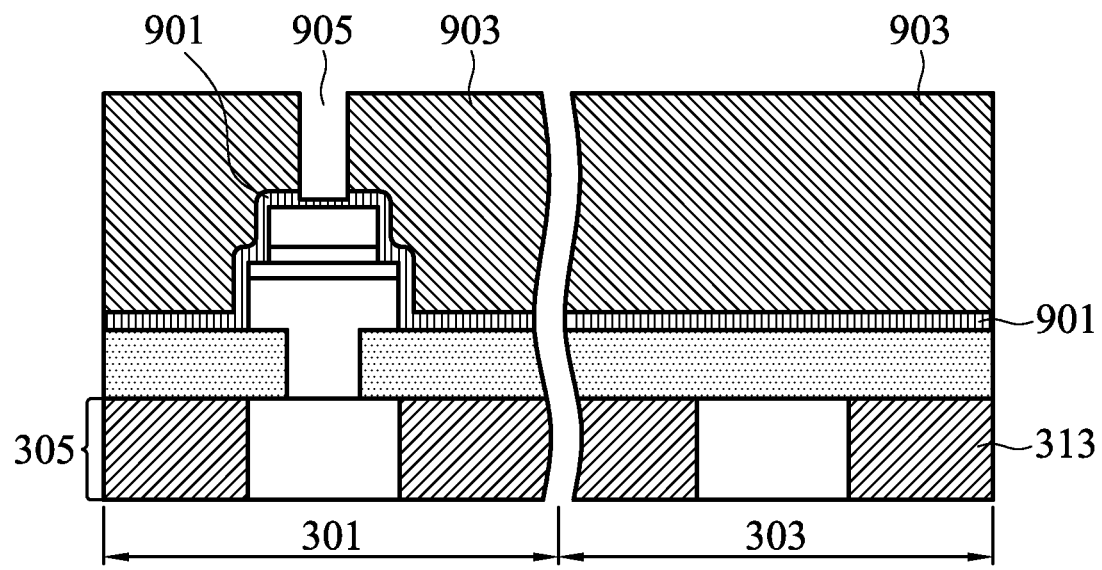

FIG. 9 is a cross section view after operation 221. The RRAM structure is conformally covered by second RRAM stop layer 901. A dielectric layer 903 fills the space between adjacent RRAM structures and covers the RRAM structures. A top electrode via 905 is etched in the dielectric layer 903 down to the second RRAM stop layer 901. In the stage as shown, the top electrode via 905 does not yet reach the top electrode; however, the top electrode via 905 is extended in a subsequent operation to the top electrode to form electrical connection with the RRAM structure.

In operation 223, a contact via is patterned in the dielectric layer for the logic device portion 303. The contact via extends from the top of the dielectric layer to the metal features in the metal/dielectric layer below the first RRAM stop layer. Operation 223 may be performed in two steps: in a first step, a first pattern and etch stops on top of the first RRAM stop layer and in a second step, the first RRAM stop layer is etched through to the metal feature in the metal/dielectric layer. The first step of pattern and etch is performed using known processes. The second step of etching through the first RRAM stop layer may be performed together with top electrode via etching in the RRAM portion as a part of operation 221.

Figure 10:
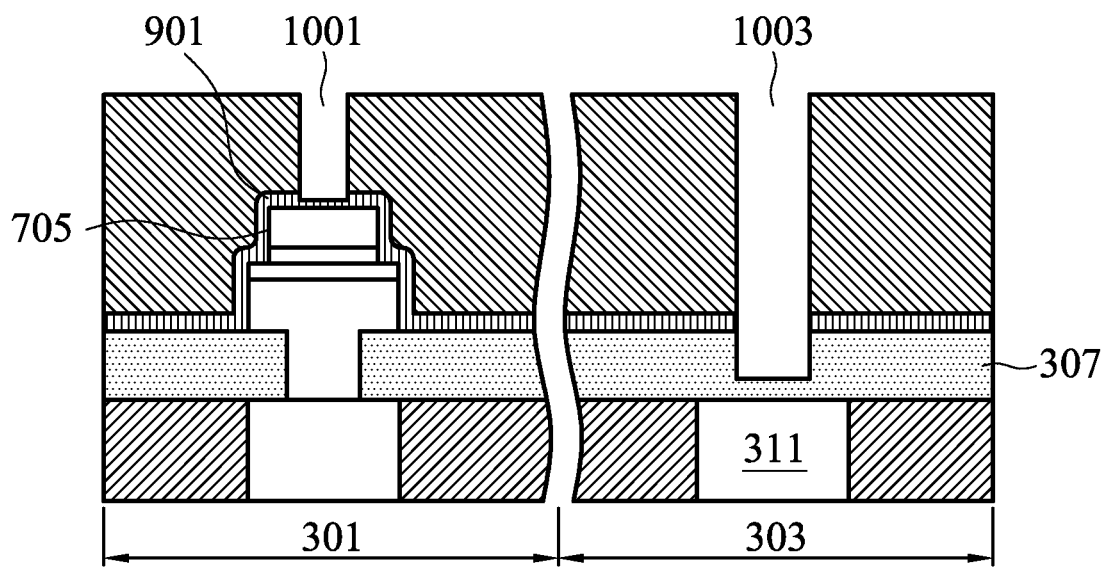

FIG. 10 is a cross sectional diagram including an RRAM portion 301 and a logic device portion 303 in an intermediate stage during operations 221 and 223. When the operations 221 and 223 are performed each in two steps, the last step of the operations 221 and 223 may be performed together. In the RRAM portion 301 of FIG. 10, the top electrode via 1001 is formed, with a small portion of the second RRAM stop layer remaining at the bottom of the top electrode via 1001. In the logic device portion 303 of FIG. 10, the contact via 1003 is formed, with a small portion of the first RRAM stop layer 307 remaining at the bottom of the via contact 1003. Because the depths of the top electrode via 1001 and the contact via 1003 varies as well as the material composition etched, the first steps of operations 221 and 223 are performed separately to ensure good process uniformity. To that end, two photomasks are used, one for operation 221 for the top electrode via and one for operation 223 for the contact via. The remaining portion of the second RRAM stop layer 901 in the RRAM portion 301 and the remaining portion of the first RRAM stop layer 307 in the logic device portion 303 may be removed at the same time to expose the top electrode 705 and metal feature 311.

Several photomasks used in the RRAM memory cell fabrication process in accordance with some embodiments are not used in the traditional CMOS fabrication process. The first additional photomask is one used for bottom electrode via patterning. The second additional photomask is one used for the top electrode patterning. The third additional photomask is one used for the bottom electrode patterning. Lastly, the fourth additional photomask is one used for the top electrode via patterning. Thus, the embedded RRAM of the present disclosure may be made with four additional photomasks as compared to traditional CMOS fabrication processes without RRAM structures. In some embodiments, one of the additional photomasks may be a mask that is used in another operation that happens to have a pattern that can be reused. In some embodiments, a reusable pattern may be one of an opposite photoresist. For example, in some embodiments, the first additional photomask may be reused as the four additional photomask by designing the RRAM structure such that the bottom electrode via and the top electrode via substantially overlap. In other embodiments, process parameter adjustments in one or more of the photolithography operations may allow the re-use of a photomask even though the features to be formed do not substantially overlap. For example, a positive photoresist may be used instead of a negative photoresist, or vice versa, to cause a different pattern when the exposure operation is performed at an angle.

Figure 11:
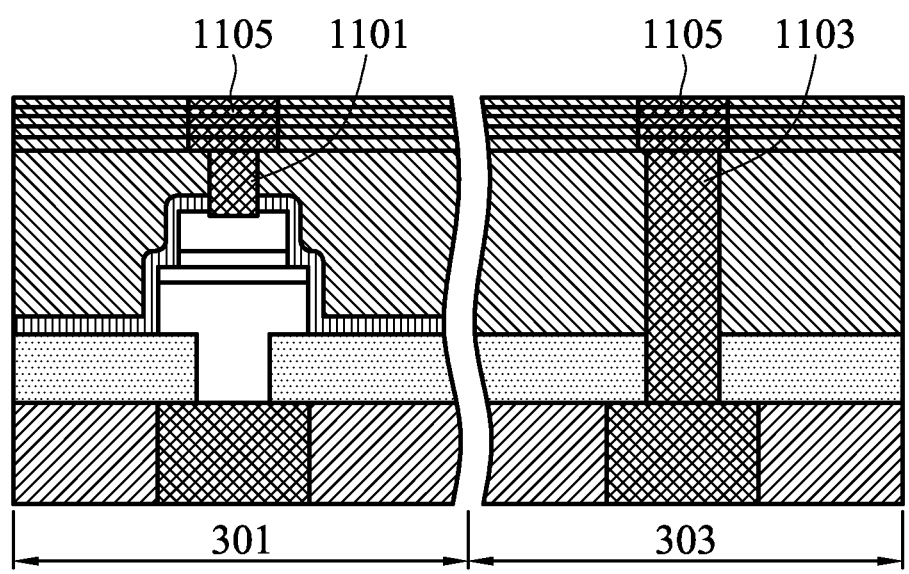

Referring back to FIG. 2, in operation 225, the top electrode via and the contact via are filled with a conductive material, usually a metal. The filling may also include one or more liner and barrier layers in additional a metal conductor. The liner and/or barrier may be conductive and deposited using CVD or PVD. The metal may be deposited using PVD or one of the plating methods, such as electrochemical plating. FIG. 11 is a cross section diagram of the partially fabricated device including a RRAM structure in a RRAM portion 301 and a logic device portion 303. The top electrode via and the contact via of FIG. 10 are filled to form the top electrode contact 1101 and the contact 1103 of FIG. 11.

Referring back to FIG. 2, in operation 227, a second metal/dielectric layer is formed over the RRAM. The second metal/dielectric layer may be formed in a similar way as the first metal/dielectric layer under the RRAM structure. In some embodiments, excess metal from the top electrode via and the contact via filling are removed by planarization, new dielectric material deposited, metal line trenches patterned and etched in the new dielectric material, and metal lines filled to form the second metal/dielectric layer. In some embodiments, the metal line trenches are patterned and etched even before the top electrode via and the contact via are filled. When dimensions are such that the filling process permits, one filling operation can fill both the contacts and the metal trenches. The first metal/dielectric layer may be a fourth metal layer on the wafer and the second metal/dielectric layer may be a fifth metal layer on the wafer. After operation 227, the RRAM structure of FIG. 1A is complete in accordance with various embodiments of the present disclosure.

In one aspect, the present disclosure pertains to an RRAM cell. The RRAM cell includes a transistor and an RRAM structure electrically connected to the transistor. The RRAM structure includes a bottom electrode, a resistive material layer, and a top electrode. The bottom electrode has a via portion and a top portion. The via portion of the bottom electrode is embedded in a first RRAM stop layer. The resistive material layer over the bottom electrode has a same width as the top portion of the bottom electrode. The top electrode over the resistive material layer has a smaller width than the resistive material layer. According to some embodiments, a ratio of the width of the top electrode to the width of the bottom electrode is from about 0.75 to about 0.55.

In another aspect, the present disclosure pertains to an RRAM cell having a transistor, an RRAM structure electrically connected to the transistor, and a conductive material connected to a top electrode of the RRAM structure. The RRAM structure further includes a bottom electrode and a resistive material layer. The bottom electrode has a via portion and a top portion. The via portion of the bottom electrode is embedded in a RRAM stop layer. The resistive material layer is over the bottom electrode and the top electrode is over the resistive material layer and includes tantalum nitride. The top electrode comprises a top face above the resistive material layer and the bottom electrode, a side face extending downwardly from the top face toward the resistive material layer and the bottom electrode, and a smaller width than the top portion of the bottom electrode.

In yet another aspect, the present disclosure pertains to a method of making a RRAM cells. The method includes forming a transistor on a substrate, depositing a first RRAM stop layer over the substrate, forming a bottom electrode via in the first RRAM stop layer, depositing a bottom electrode layer in the bottom electrode via and over the first RRAM stop layer, depositing a resistive material layer over the bottom electrode layer, depositing a top electrode layer over the resistive material layer, forming a top electrode by patterning the top electrode layer, and forming a bottom electrode, after forming the top electrode, by patterning the bottom electrode layer. The top electrode has a smaller width than the bottom electrode.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A resistive random access memory (RRAM) cell, comprising:
   a transistor; and
   an RRAM structure electrically connected to the transistor and having
      a bottom electrode having a via portion and a top portion, wherein said via portion of the bottom electrode is embedded in a first RRAM stop layer;
      a resistive material layer over the bottom electrode and having a same width as the top portion of the bottom electrode; and
      a top electrode over the resistive material layer and having a smaller width than the resistive material layer, wherein a full width of the entirety of the top electrode is substantially constant.

2. The RRAM cell of claim 1, wherein the RRAM structure further has a capping layer over the resistive material layer.

3. The RRAM cell of claim 2, wherein the capping layer has a same width as the top electrode.

4. The RRAM cell of claim 1, wherein a ratio of the width of the top electrode to the width of the bottom electrode is about or less than 0.75.

5. The RRAM cell of claim 1, wherein a ratio of the width of the top electrode to the width of the bottom electrode is from about 0.55 to about 0.75.

6. The RRAM cell of claim 1, wherein the RRAM structure further has a second RRAM stop layer over and surrounding the top electrode, the resistive material layer, and the bottom electrode.

7. The RRAM cell of claim 1, further comprising three or more metal layers between the transistor and the RRAM structure.

8. The RRAM cell of claim 1, wherein the resistive material layer comprises hafnium oxide, zirconium oxide, aluminum oxide, nickel oxide, tantalum oxide or titanium oxide.

9. The RRAM cell of claim 1, wherein a ratio of a thinnest thickness of the top portion to a thickest thickness of the top portion ranges from about 0.95 to 1.

10. The RRAM cell of claim 1, wherein the number of the transistors and the number of the RRAM structures are in a ratio of 1:1.

11. A resistive random access memory (RRAM) cell, comprising:
    a transistor;
    an RRAM structure electrically connected to the transistor and having
       a bottom electrode having a via portion and a top portion, wherein said via portion of the bottom electrode is embedded in a RRAM stop layer;
       a resistive material layer over the bottom electrode;
       a top electrode over the resistive material layer and including tantalum nitride; and
    a conductive material connected to the top electrode of the RRAM structure; and
    a continuous second RRAM stop layer directly contacting a top surface of the top electrode and sidewalls of the top electrode and the bottom electrode;
    wherein the top electrode comprises
       a top face above the resistive material layer and the bottom electrode,
       a side face extending downwardly from the top face toward the resistive material layer and the bottom electrode, and
       a smaller width than the top portion of the bottom electrode.

12. The RRAM cell of claim 11, wherein the RRAM structure further comprises a capping layer over the bottom electrode, the capping layer comprising titanium, hafnium, platinum, or tantalum.

13. The RRAM cell of claim 11, wherein a ratio of a width of the top electrode to a width of the bottom electrode is equal to or less than 0.75.

14. The RRAM cell of claim 11, wherein the second RRAM stop layer is over and surrounds the top electrode, the resistive material layer, and the bottom electrode.

15. The RRAM cell of claim 11, wherein a ratio of a thinnest thickness of the top portion to a thickest thickness of the top portion ranges from about 0.95 to 1.

16. The RRAM cell of claim 11, wherein the resistive material layer comprises hafnium oxide, zirconium oxide, aluminum oxide, nickel oxide, tantalum oxide or titanium oxide.

17. A resistive random access memory (RRAM) structure, comprising:
    a bottom electrode comprising a via portion and a top portion, wherein a ratio of a thinnest thickness of the top portion to a thickest thickness of the top portion ranges from about 0.95 to 1;

a resistive material layer over the bottom electrode;

a top electrode over the resistive material layer, the top electrode having a width smaller than a width of the top portion of the bottom electrode;

a continuous second RRAM stop layer contacting a top surface of the resistive material layer and a sidewall of the bottom electrode; and a dielectric material covering the continuous second RRAM stop layer.

18. The RRAM cell of claim 17, further comprising a capping layer over the bottom electrode, and the capping layer comprising titanium, hafnium, platinum, or tantalum.

19. The RRAM cell of claim 17, wherein a ratio of the width of the top electrode to the width of the bottom electrode is equal to or less than 0.75.

20. The RRAM cell of claim 17, a wherein the continuous second RRAM stop layer is over and surrounding the top electrode, the resistive material layer, and the bottom electrode.

* * * * *